Dec. 10, 1968 P. R. THOMAS ET AL 3,416,042

MICROWAVE INTEGRATED CIRCUIT MIXER

Filed Sept. 18, 1964

3,416,042

MICROWAVE INTEGRATED CIRCUIT MIXER

Philip R. Thomas and Tom M. Hyltin, Dallas, Tex., assignors to Texas Instruments Incorporated, Dallas, Tex., a corporation of Delaware Filed Sept. 18, 1964, Ser. No. 397,480
13 Claims. (Cl. 317—234)

This invention relates to a microwave mixer for operation at frequencies as high as in the X-band, and more specifically to an integrated mixer circuit having a low noise characteristic with minimal conversion loss.

In microwave systems, the receiving channel and the quality of the receiver to a large extent determine the performance capabilities of the system and dictate the other system parameters. In spite of recent developments in semiconductor mixers and low noise IF amplifiers, the noise characteristics of the mixer have continued to represent a major problem in optimum design and operation of microwave receivers.

The fundamental operation of a mixer is to convert a microwave frequency to a lower frequency with a minimum of added noise. The conversion for optimum should be with minimum loss. Generally speaking, it is necessary that a received microwave signal and a signal from a local oscillator be applied to a semiconductor junction from which the difference frequency for IF output is extracted.

In those applications where a microwave mixer must be a broad band device the use of duplexing filters is excluded. Further, to keep the loss of the signal circuit as low as possible, the mixer must include a high ratio coupler. The construction of a mixer circuit in a form compatible with integrated circuit construction has not heretofore been realized.

It is an object of the present invention to provide a broad band mixer circuit in integrated circuit form capable of operating at frequencies as high as in the X-band. It is further an object of the invention to provide a mixer circuit having strip line transmission circuits which include a surface-oriented diode on a semiconductive wafer.

More particularly, in accordance with the present invention a mixer is provided which includes a semiconductive wafer the bulk of which is substantially intrinsic and with opposed major faces, the first of which includes a continuous layer of high conductivity. On the other face of the wafer conductive strips extend from two signal input terminals and are at least in part parallel with cross strips extending therebetween for coupling the signals applied to the two inputs. In an output portion of the strip lines and in series with each of the strips are spaced apart zones of opposite conductivity types forming surface-oriented diodes leading from the coupler to output terminals of the strips.

In a more specific aspect, the conductive strips in the zone of the coupler are charcterized by abrupt transitions therein at points spaced about a quarter wavelength apart with cross strips extending therebetween at location about a quarter wavelength apart. Further abrupt transitions are formed about a quarter wave from the contacts between the conductive strips and the zones of opposite conductivity type.

For a more complete understanding of the present invention and for further objects and advantages thereof, reference may now be had to the following description taken in connection with the accompanying drawings in which.

Figures 1, 2, 3, 4, 5, 6, 7, 8, 9:
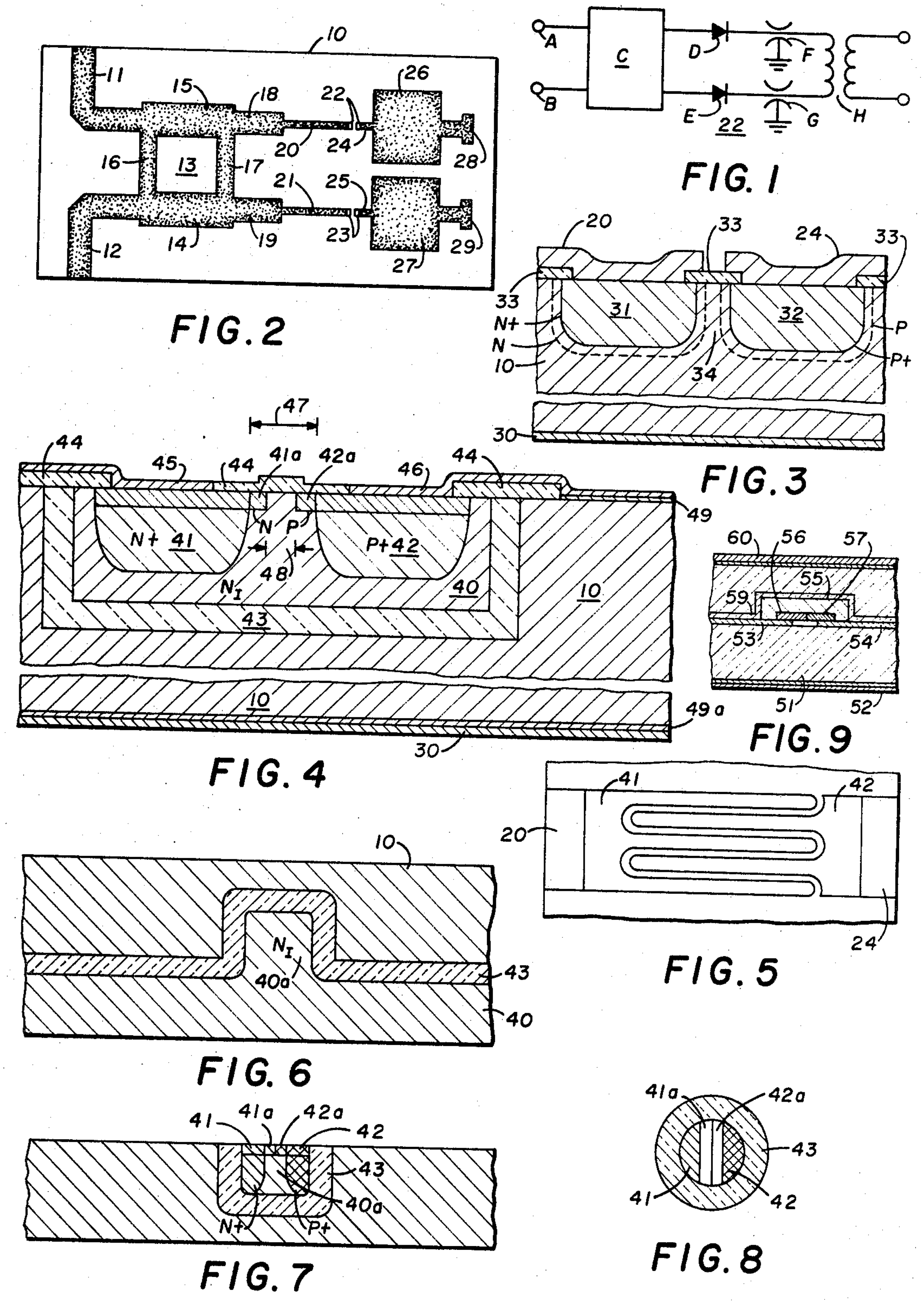
FIGURE 1 is a lumped constant representation of a balanced mixer employing a coupler and two mixer diodes.
FIGURE 2 is a plan view of an integrated circuit embodiment of FIGURE 1.
FIGURE 3 is a surface-oriented diode of the mixer of FIGURE 2.
FIGURE 4 is a modified form of a surface-oriented diode of the mixer of FIGURE 2.
FIGURE 5 illustrates an interdigitated surface-oriented diode.
FIGURES 6–8 illustrate diode fabrications with insulation isolation.
FIGURE 9 is a hybrid mixer circuit employing a surface-oriented diode wafer in a strip-line transmission system.

Referring now to FIGURE 1, a mixer circuit involves a signal input terminal A and a local oscillator input terminal B leading to coupler C. Output lines from coupler C extend to diodes D and E, respectively, with shunt capacitances F and G leading to ground. An output transformer H provides a path for an output signal from the mixer which may be one of the modulation products from the mixer.

The present invention involves the construction of a diode particularly suitable for use as the diodes D and E in an integrated semiconductor circuit embodiment such as represented by the mixer of FIGURE 1.

A mixer converts the received signal to a lower frequency preferably with a minimum of added noise. To optimize the noise level for the receiver, both the signal-to-noise ratio of the mixer and the conversion loss in the mixer must be as low as possible. A detected microwave signal and a local oscillator output signal are applied to a semiconductor junction and the difference, as an IF output signal, is extracted. Mixers employing diodes constructed in accordance with the present invention and illustrated in FIGURES 2–5 may be employed for operation at frequencies in the X-band. Operation thereof is characterized by low loss, employing high ratio couplers of integrated circuit form.

More particularly, as shown in FIGURE 2, a semiconductor wafer 10 is provided with a signal input strip 11 and a local oscillator input strip 12. Strips 11 and 12 are metalized regions overlaying a high-resistivity semiconductor wafer. The metalized regions 11 and 12 lead to the input portions of a hybrid coupler 13. The coupler 13 is provided with parallel sections 14 and 15 which are about one-quarter wavelength long and are of a width substantially greater than the width of the strips 11 and 12. Two shunt strips 16 and 17 are spaced approximately one-quarter wavelength apart and extend between sections 14 and 15. Output lines 18 and 19 extend from the coupler 13.

A pair of quarter-wave transformer sections 20 and 21 extend from the output strips 18 and 19, respectively, and make contact with terminals of surface-oriented diodes 22 and 23, respectively. Output conductors 24 and 25 lead from the other terminals of diodes 22 and 23 to output capacitors 26 and 27 to provide an output signal at output terminals 28 and 29.

With strip-line transmission lines overlaying the semiconductor wafer 10 and with surface-oriented diodes of a construction hereinafter described, a signal in the X-band may be converted to IF with about a 5 db loss. For example, a 9 gc. signal may be applied to strip 11. A local oscillator signal at 8.5 gc. may be applied to the input strip 12. As a result, an IF signal of 500 mc. is produced at terminals 28 and 29.

The surface-oriented diode 22 is illustrated in one form in FIGURE 3. The wafer 10, of intrinsic silicon, is provided with a ground plane conductive layer 30. The intrinsic silicon forms a high-resistivity zone above the ground plane layer 30. An N-type alloyed region 31 and a P-type alloyed region 32 are formed in the surface of the wafer 10 opposite the ground plane layer 30. A silicon dioxide insulating layer 33 is formed over the upper surface of wafer 10 to cover the surface emergence of the junctions forming the boundaries between the P-type and N-type alloyed sections and the intrinsic wafer 10. An N-type metal alloy strip 20 is then formed on the surface of the wafer 10 so as to make electrical contact with the N-type region 31. A P-type metal alloy strip 24 is formed on the surface to make electrical contact with the region 32. The P-type and N-type metal alloy strips 20 and 24 are evaporated onto the surface through holes in oxide masks defined by photolithographic techniques. The metal alloy strips are then alloyed into the silicon to produce the N+ and P+ regions between the strips and the N-type and P-type regions 31 and 32. An intrinsic region 34 is disposed between the N and P regions, the boundary junctions of which are shown in dotted outline.

Such fabrication of the surface-oriented mixer diode is in a form compatible with the integrated circuit construction. The diode is a substantial improvement over conventional microwave mixer elements. Previous mixer diodes have been of the point contact variety in order to maintain low junction capacitance. The present construction has achieved junction capacitances of 0.05 picofarad (pf.) or less. When biased by rectification of the local oscillator signal to obtain the best noise figure, the shunt resistance of the junction of the present invention is approximately 400 ohms. In ordinary mixer diode configuration, this value of resistance is transformed to an input impedance of about 50 to 100 ohms by the package inductance and the junction capacitance. In the present case, the junction diameter of the diode is approximately 0.1 mil (0.0001 inch). Production of a semiconductor junction of this size, as above noted, employs intrinsic silicon having side-by-side alloy zones to form confronting edge junctions that will give the surface diode effect.

The material required for the integrated circuit preferably will provide a suitable substrate for microwave strip transmission lines and for forming the mixer semiconductor junctions. Intrinsic silicon and high-resistivity gallium arsenide may be employed for mixer diodes, whereas germanium has characteristics which are not suitable for both the microwave strip transmission line and the diode construction. Where extremely low loss transmission lines are required, low loss dielectrics with deposited silver conductors are employed. Yttrium-iron-garnet (yig) substrates may also be employed for this purpose.

FIGURE 4 illustrates a modified form of surface-oriented diode wherein side-by-side diffusions of opposite-conductivity type impurities are formed on the upper surface of an intrinsic silicon wafer 40. The N-type diffused zone 41*a* and the P-type diffused zone 42*a* are characterized by an edge junction that will give the surface diode effect. The zones 41*a* and 42*a* are formed partially in N+ and P+ diffusion zones 41 and 42, respectively, which in turn are formed in an insulated island of intrinsic silicon about 1 mil wide and 3 mils long formed in the wafer by an insulating layer 43 of silicon dioxide.

The spacing between the edges of the diffused N+ and P+ zones 41 and 42 is about 0.3 mil in zone 47. However, the zone 48 between the confronting junctions of the N and P zones 41*a* and 42*a* is about 0.1 mil wide. The capacitance of the junction is defined by the effective junction area of the shallow diffusions and the reverse breakdown by the shallow diffused spacing and the intrinsic or I-layer concentration. Conductivity modulation under forward current conditions is minimized by reason of the effective increase injection area of the anode of the deep P+ diffusion. The problem is in defining the I-layer between the diffusion fronts so that a sufficient current density can be obtained at reasonable current levels. For currents of 20 milliamps, about a 4 square mil area will give a current density of 200 amps per square centimeter required for conductivity modulation. An insulating layer 44 covers the surface of the wafer except for metalized contact zones 45 and 46.

Surface-oriented diodes of the type illustrated in FIGURES 3 and 4 may be employed in the mixer of FIGURE 2. Where additional current-carrying capacity is required of surface-oriented diodes, as in the transmit-receive switches employed in various systems, the construction such as shown in FIGURE 5 may be employed.

In FIGURE 5, the transmission lines 20 and 24 are shown contacting the diffused zones 41 and 42, respectively. The diffused zone 41 has three fingers. The zone 42 has two fingers with the fingers being enmeshed or interdigitated to provide a junction of high-carrying capability. Such a construction exhibits low junction capacitance under moderate reversed-bias conditions and low loss.

Intrinsic silicon as the substrate material for the diodes provides insulation isolation for any number of components deposited upon it and also provides a low loss structure. The structure is readily adaptable to receiving strip transmission lines deposited directly onto the silicon. In accordance with one mode of fabrication, a ground plane conductor is evaporated onto the bottom of an intrinsic silicon substrate of approximately 5 mils thickness. Silicon dioxide on the top is etched to expose the silicon where transmission lines are required. Gold is then evaporated over the entire surface and selectively removed to leave gold over the exposed region of the silicon. Preferably, in order to maintain the propagation properties of the lines, the alloying of gold with silicon will be avoided, as by the forming of a thin layer, a few microns thick, of a material such as molybdenum between the gold strips and the silicon.

As an alternative mode of fabrication, a hot substrate evaporation of gold onto the intrinsic silicon is carried out. The gold is then etched away to leave the transmission lines where required. At microwave frequencies, the degradation of leakage current due to the introduction of the gold into the silicon is of little consequence. In the same manner, aluminum strip transmission lines may be formed on gallium arsenide to form the transmission line pattern on a given substrate. Thus, the mixer of FIGURE 2 is a flat, integrated circuit package. The integrated circuit may be part of more complex circuits formed on the same or interconnected substrates.

Referring again to FIGURE 4, a diffused, surface-oriented diode with insulation isolation represents a preferred embodiment of the invention. One procedure for forming this structure is shown in FIGURES 6–8. The structure illustrated in FIGURES 6–8 is similar to the structure illustrated in FIGURE 4, and corresponding parts will therefore be designated by corresponding reference numerals. However, the structure of FIGURES 6–8 is illustrated as round while the structure of FIGURE 4 is rectangular. The surface of a single crystal, high-resistivity substrate of N-type material is etched on the surface to form a mesa 40*a* on the top surface. The oxide layer 43 is then grown over the upper surface of the etched wafer and over the mesa 40*a* to form an insulating layer over the entire etched surface. The material forming the bulk substrate 10 of the structure in FIGURE 4 is then deposited or grown over the top of the slice 40 to completely cover the insulation layer 43 and to surround the insulation covered mesa. After the bulk material 10 is grown onto the top of the wafer, the top (in FIGURE 6) of the bulk material 10 is lapped smooth for receiving the ground plane conducting layer 30 shown in FIGURE 4.

The substrate 40 is then lapped so that all of the original wafer is removed except for the mesa which is then the island 40*a* located in a well or depression surrounded by the isolation layer of silicon oxide 43 as shown in FIGURE 7. Thereafter as shown in FIGURE 8, through a photomasking technique, N+ and P+ diffusions are made to form the zones 41 and 42 of oppositely-conductivity types in the island 40*a*. Inside the island there is then high enough impurity concentration for good low resistivity ohmic contact. The low resistivity (high concentration) diffusions have a very narrow intrinsic zone between them, of the order of 0.3 mil wide. Into this area of original material, there are made two very shallow diffusions 41a and 42a of N and P-type materials, respectively. The diffusions are very shallow (3 lines or 3×0.016 mil) with high concentrations. The junction between the N and P shallow diffusion zones 41a and 42a is not or need not be accurately positioned as long as it is within the 0.3 mil strip. The junction between the two zones is 1 mil wide and 3 lines deep or an area of 1×3×0.016 mils=0.048 sq. mil. This results in a very low capacitance junction suitable for use in the mixer of FIGURE 1. Contacts 45 and 46 are readily applied to the two N+ and P+ regions of FIGURES 7 and 8 to be used for bonding or pressure contacts alloyed in.

Where the diode is to be employed in the mixer application, the separation 48, FIGURE 4, between the junctions will be reduced to zero. The boundaries of the two zones will thus be contiguous. Surface-oriented diodes for use in switching applications will be constructed with separation between the two zones and for high current capability, will be interdigitated as shown in FIGURE 5.

In FIGURE 4, the transmission lines 45 and 46 extend along the top of the insulating layer 44 from contact with the zones 41 and 42. Preferably, the transmission line leading to and from the surface-oriented diode, except for the insulation over the junctions as shown in FIGURE 4, will be formed directly on the surface of the semiconductor material 10. Preferably, ground plane conductor 30 and the low resistance conductive strips 45 and 46 are gold and overlay an extremely thin film of a metal such as molybdenum, as above noted, or of vanadium, platinum, nickel or tungsten evaporated to a thickness of a few microns to form an underlayer for each strip. The underlayer having a high eutectic temperature will prevent the formation of lossy zones that would otherwise be present were gold strips to be formed directly onto the silicon surface and then subjected to treatment at temperatures wherein the silicon would become intermixed with the gold at the boundary thereof. Such zones are avoided by the use of the thin film 49. The ground plane layer 30 is shown as having been formed over a film 49a on the bottom surface of the structure as shown in FIGURE 4 where the film 49a would be of materials the same as film 49.

In FIGURE 9, a modified form of surface-oriented diode is illustrated in which a ceramic substrate 51 is provided with a ground plane conductive layer 52 on the bottom thereof. Conductive strips 53 and 54 are formed on the top of the ceramic wafer 51. A semiconductor wafer 55 having a surface-oriented diode with zones 56 and 57 therein is inverted on the top of the ceramic wafer 51 with the zone 56 contacting strip 53, and the zone 57 contacting strip 54. This construction employs ceramic wafers and is of construction such that a coaxial output configuration may be readily coupled thereto. This is accomplished by depositing a glass layer 58 on top of the substrate 51 and the wafer 55. As illustrated, an insulating layer 59 is formed on the upper surface of the structure before deposition or addition of the glass layer 58. A ground plane conductive layer 60 is then formed on the top of the glass layer 58 and is electrically connected to the ground plane conductor 52 for shielding the transmission channel formed in the structure of FIGURE 6. The surface-oriented diode 55 may be formed as above described in connection with FIGURES 2–5.

In the operation of the mixer, the signals to be mixed and modulated are applied to the input sections 11 and 12 of the coupler. The input sections apply the signals to the two adjacent corners of the square formed by the quarter wavelength sections 14, 15, 16 and 17. The cross-sectional area of the sections 14 and 15 are so chosen with respect to the cross section of the input sections 11 and 12 and the transverse sections 16 and 17 that each of the signals applied to the respective input sections is evenly divided between the coupler output sections 18 and 19 without feedback to the other input section. The output sections 18 and 19 are coupled to the mixer diodes by quarter wavelength transformer sections 20 and 21 which are selected in cross section so as to match the impedance of the coupler to the impedance of the diode. The mixer output sections 24 and 25 include large areas 26 and 27 which form output filters for removing high frequency noise from the output signals at output terminals 28 and 29. The sizing of the various sections may be easily accomplished by those skilled in the art using standard techniques. Although a particular preferred hybrid coupler has been described, it is to be understood that within the broader aspects of this invention, a strip-line coupler configuration can be used, including couplers using only a single diode.

From the above it will be noted that a novel mixer device has been described. The mixer illustrated includes a coupler connected to one or more mixer diodes by impedance matching transformers, and output filters. Yet the entire mixer is formed as an integral unit on a single substrate. The substrate is preferably intrinsic silicon or high-resistivity gallium arsenide so as to provide a high dielectric substrate. The strip lines forming the mixer are preferably gold with a very thin underlayer of high eutectic metal such as molybdenum so as to obtain low resistivity and a low loss transmission line structure. Although a hybrid coupler with dual diode mixers is disclosed, and is a preferred embodiment, other types of couplers may be formed from the strip lines including single diode type systems. The mixer includes a diode which has a low capacitance because of very low junction area, yet the mixer is formed in the substrate and both terminals of the device emerge at spaced points at the surface of the substrate so that good contact can be made with the terminals merely by extending the strip lines over the terminal zones.

The strip-line sructures of the mixer device is described and claimed in copending application S.N. 397,492, filed on Sept. 18, 1964, by John R. Biard, and assigned to the assignee of this invention.

The diode structure of the mixer device is described and claimed in U.S. Patent No. 3,374,404, assigned to the assignee of this invention.

Although preferred embodiments of the invention have been described in detail, it is to be understood that various changes, substitutions and alterations can be made therein without departing from the spirit and scope of the invention as described by the appended claims.

We claim:

1. A mixer for modulating radar-frequency signals which comprises:

(a) a substantially intrinsic semiconductor wafer having opposite surfaces, (b) a continuous metallic layer adjacent one of said opposite surfaces to provide a conductive ground plane layer, (c) a plurality of thin metallic films providing conductive striplines deposited on the other surface of the wafer and forming a coupler including a pair of input portions for receiving a pair of input signals and a pair of output portions, (d) a pair of surface-oriented diodes in said wafer, each diode comprised of a first zone of one conductivity type and a second zone of opposite conductivity type, said first and second zones being laterally spaced from one another along and extending solely to said other surface, a pair of junctions formed by the intersection of each of said zones with said wafer extending solely to said other surface with intrinsic semiconductor material of said wafer separating said pair of junctions, the coupler output portions being respectively electrically connected with the first zone of each of the said diodes at said other surface, and (e) a pair of thin metallic films providing conductive striplines respectively electrically connected with the second zone of each of the said diodes at said other surface and forming a pair of output portions for the mixer.

2. The combination defined in claim 1 in which the coupler output portions electrically connected with the first zones of the diodes are sized to form impedance matching transformers to match the impedance of the coupler to the impedance of the diodes.

3. The combination defined in claim 1 in which the coupler portions electrically connected with the first zones of the diodes are quarter-wave transformer sections to match the impedance of the coupler to the diodes.

4. The combination defined in claim 1 in which each of the conductive strip lines forming the output portions for the mixer has an enlarged portion forming one plate of a capacitor with the ground plane forming the other plate.

5. A mixer for modulating radar-frequency signals which comprises:

(a) a high dielectric substrate having opposite surfaces,
(b) a continuous layer adjacent substantially all of one of the said surfaces of the said substrate forming a ground plane for said mixer,
(c) a plurality of thin metallic films overlying the other surface of the said substrate providing conductive striplines forming a pair of input terminal portions for receiving a pair of input signals, a coupler portion for combining said pair of input signals, and a pair of output terminal portions of said coupler portion,
(d) a pair of diodes formed in said substrate each having an anode and cathode zone with a junction area intermediate said anode and cathode zones, said anode and cathode zones and said junction area extending solely to said other surface, said pair of output terminal portions of said coupler portion respectively electrically connected with one of the said zones of each of said pair of diodes at said other surface, and
(e) a pair of thin metallic films providing conductive striplines also overlying the said other surface respectively electrically connected at said other surface with the other of the said zones of each of the said pair of diodes to provide a pair of output terminal portions for said mixer.

6. The combination defined in claim 5 wherein the anode and cathode zones are formed in a semiconductor wafer disposed in the substrate and isolated from the remainder of the substrate by an insulation layer.

7. The combination defined in claim 5 wherein the anode and cathode zones are diffused.

8. The combination defined in claim 5 wherein each of the anode and cathode zones includes a relatively deep-high impurity concentration region in contact with the respective strip lines to provide a highly conductive contact, and a relatively shallow, low impurity concentration region adjacent said junction area thereby to allow for high frequency operation.

9. The combination defined in claim 5 wherein the substrate is primarily high-resistivity gallium arsenide semiconductor material.

10. The combination defined in claim 5 wherein the substrate is intrinsic silicon.

11. The combination defined in claim 10 wherein the thin metallic films providing the strip line conductors are comprised of a thin high eutectic metal film deposited on the surface of the silicon and an overlying layer of gold.

12. The combination defined in claim 5 wherein the said coupler portion is comprised of a pair of input strip-line sections extending to two adjacent corners of a square formed by four quarter wavelength strip-line sections and two output strip-line sections extend from the opposite two corners of the square, the cross sections of the four quarter wavelength strip-line sections being so sized that the signal introduced through each input section will be split evenly between the output sections without feedback through the other input section.

13. The combination defined in claim 12 wherein the output terminal portion of the coupler are connected to the respective zone of the respective diode by quarter wavelength sections having a cross section selected to match the impedance of the coupler to the impedance of the diode.

References Cited

UNITED STATES PATENTS

| | | | |
|---|---|---|---|
| 2,981,877 | 4/1961 | Noyce | 317—235 |
| 3,008,089 | 11/1961 | Uhlir | 330—5 |
| 3,011,104 | 11/1961 | Watanabe et al. | 317—234 |
| 3,022,472 | 2/1962 | Tanenbaum et al. | 333—18 |
| 3,111,634 | 11/1963 | Ammerman et al. | 332—52 |
| 3,212,033 | 10/1965 | Husher et al. | 333—70 |

JOHN W. HUCKERT, *Primary Examiner.*

R. F. SANDLER, *Assistant Examiner.*

U.S. Cl. X.R.

333—70; 325—449